United States Patent
Yoshimatsu et al.

(10) Patent No.: US 12,334,408 B2
(45) Date of Patent: Jun. 17, 2025

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Naoki Yoshimatsu, Tokyo (JP); Nobuyoshi Kimoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 558 days.

(21) Appl. No.: 17/757,938

(22) PCT Filed: Mar. 19, 2020

(86) PCT No.: PCT/JP2020/012175
§ 371 (c)(1),
(2) Date: Jun. 23, 2022

(87) PCT Pub. No.: WO2021/186657
PCT Pub. Date: Sep. 23, 2021

(65) Prior Publication Data
US 2023/0045523 A1  Feb. 9, 2023

(51) Int. Cl.
*H01L 23/31* (2006.01)
*H01L 23/00* (2006.01)

(52) U.S. Cl.
CPC .......... *H01L 23/3142* (2013.01); *H01L 24/18* (2013.01); *H01L 24/48* (2013.01);
(Continued)

(58) Field of Classification Search
CPC ..... H01L 23/3142; H01L 24/18; H01L 24/48; H01L 2224/48091; H01L 2224/48247;
(Continued)

(56) References Cited

U.S. PATENT DOCUMENTS

| 5,807,768 A | 9/1998 | Shin | |
|---|---|---|---|
| 2007/0228534 A1* | 10/2007 | Uno | H01L 24/48 257/E23.079 |

FOREIGN PATENT DOCUMENTS

| JP | H01-107143 U | 7/1989 |
|---|---|---|
| JP | H05-259344 A | 10/1993 |

(Continued)

OTHER PUBLICATIONS

An Office Action mailed by the State Intellectual Property Office of the People's Republic of China on Oct. 9, 2024, which corresponds to Chinese Patent Application No. 202080098494.5 and is related to U.S. Appl. No. 17/757,938; with English language translation.

(Continued)

*Primary Examiner* — Mohammad A Rahman
(74) *Attorney, Agent, or Firm* — Studebaker Brackett PLLC

(57) ABSTRACT

An object is to provide a technique capable of suppressing generation of a crack in a molding resin and suppressing entry of moisture from the outside. A semiconductor device includes a heat spreader, a semiconductor element provided on an upper surface of the heat spreader, an insulating sheet provided on a lower surface of the heat spreader, a lead frame joined to an upper surface of the semiconductor element via solder, and a molding resin that seals one end side of the lead frame, the semiconductor element, the heat spreader, and the insulating sheet. A hole is formed from an upper surface of the molding resin to a joining surface of the lead frame with the semiconductor element, and the hole is filled with a low Young's modulus resin having a Young's modulus lower than that of the molding resin.

7 Claims, 8 Drawing Sheets

(52) U.S. Cl.
CPC ............... *H01L 2224/48091* (2013.01); *H01L 2224/48247* (2013.01); *H01L 2924/1811* (2013.01)

(58) Field of Classification Search
CPC ......... H01L 2924/1811; H01L 23/3735; H01L 23/49562; H01L 24/73; H01L 21/565; H01L 23/315; H01L 23/4334; H01L 23/562; H01L 23/16; H01L 23/3121; H01L 23/28
See application file for complete search history.

(56) References Cited

FOREIGN PATENT DOCUMENTS

| | | |
|---|---|---|
| JP | 2002-261201 A | 9/2002 |
| JP | 2007-266218 A | 10/2007 |
| JP | 2013-149643 A | 8/2013 |
| JP | 2016-167480 A | 9/2016 |

OTHER PUBLICATIONS

An Office Action mailed by the Japanese Patent Office on Sep. 27, 2022, which corresponds to Japanese Application No. 2022-507948 with English translation.
An Office Action issued by the German Patent and Trademark Office on Jun. 29, 2024, which corresponds to German Patent Application No. 112020006926.5 and is related to U.S. Appl. No. 17/757,938; with English language translation.
International Search Report issued in PCT/JP2020/012175; mailed Aug. 4, 2020.

\* cited by examiner

F I G. 1
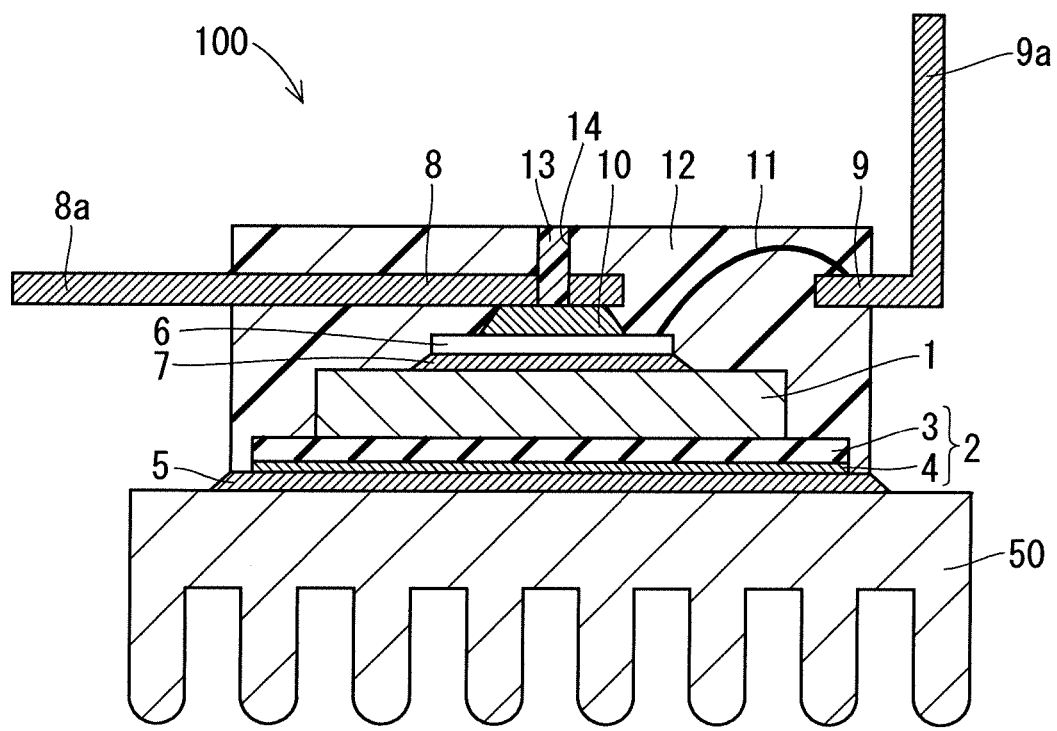

F I G. 2
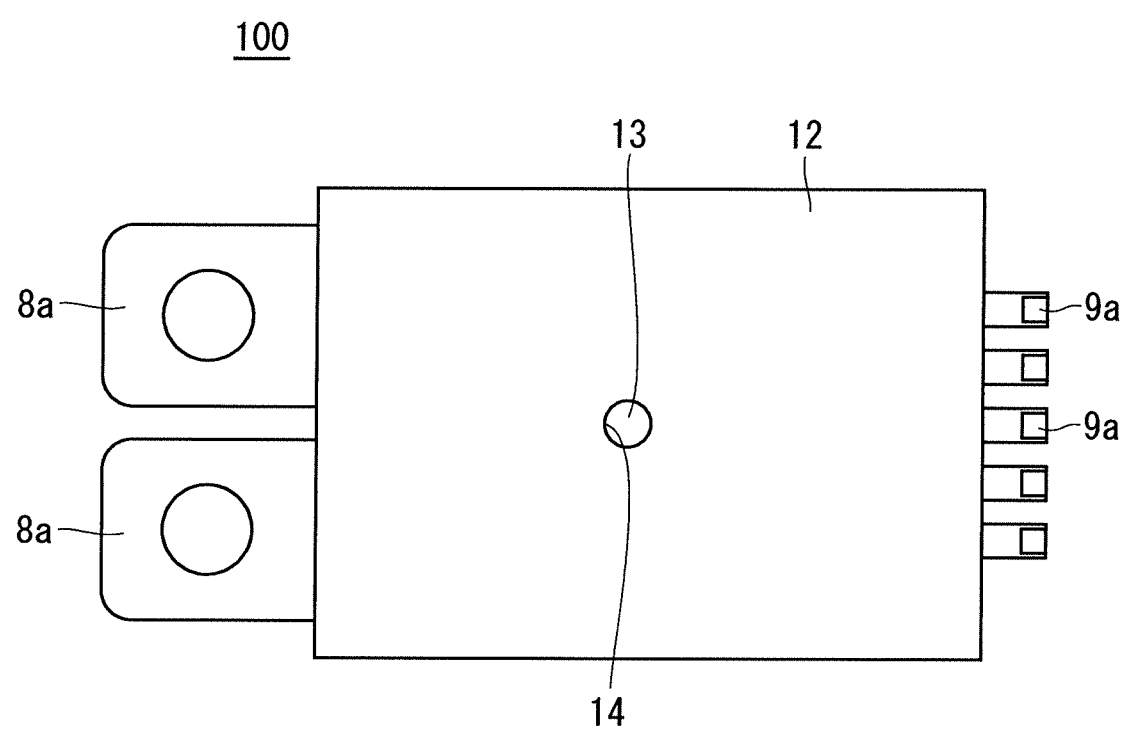

SEMICONDUCTOR DEVICE AND METHOD FOR MANUFACTURING SEMICONDUCTOR DEVICE

TECHNICAL FIELD

The present disclosure relates to a semiconductor device and a method for manufacturing the semiconductor device.

BACKGROUND ART

When a resin-molded power semiconductor device is mounted on a cooler, heat dissipation grease is filled so as to fill a gap of a contact surface with the cooler. Heat generated from the semiconductor device is transferred to the cooler via the grease, and the semiconductor device is cooled by heat exchange with cooling water or air in the cooler.

In order to incorporate a semiconductor device into an inverter of an electric vehicle or the like, miniaturization of the semiconductor device is required, and an increase in power density of a semiconductor element is required. Therefore, the miniaturization and improvement of heat dissipation performance are required for the semiconductor device. Therefore, it is conceivable to improve the thermal resistance by replacing the grease that hardly conducts heat in a heat dissipation path with metal such as solder, and to take measures against pumping out of the grease generated along with the repeated operation of the semiconductor element.

However, simply replacing the grease with the solder causes other problems. For example, since the semiconductor device needs to be heated to a high temperature at the time of soldering, the solder for joining the semiconductor element and a lead frame melts. Since the molten solder expands in volume, a crack is generated in the molding resin, and there is a possibility that the solder spurts.

There has been disclosed a semiconductor device in which a hole that penetrates a die pad from a molding resin and leads to solder is formed in order to release the solder corresponding to the volume expansion when the solder joining a semiconductor element and a lead frame melts (see, for example, Patent Document 1).

PRIOR ART DOCUMENT

Patent Document

Patent Document 1: Japanese Patent Application Laid-Open No. 5-259344 (1993)

SUMMARY

Problem to be Solved by the Invention

However, in the technique described in Patent Document 1, moisture enters from the outside through the hole, so that there is a concern about deterioration in withstand voltage and corrosion of the semiconductor element.

Therefore, an object of the present disclosure is to provide a technique capable of suppressing generation of a crack in a molding resin and suppressing entry of moisture from the outside.

Means to Solve the Problem

A semiconductor device according to the present disclosure includes: a heat spreader; a semiconductor element provided on an upper surface of the heat spreader; an insulating sheet provided on a lower surface of the heat spreader; a lead frame joined to an upper surface of the semiconductor element via solder; and a molding resin that seals one end side of the lead frame, the semiconductor element, the heat spreader, and the insulating sheet, in which a hole is formed from an upper surface of the molding resin to a joining surface of the lead frame with the semiconductor element, and in which the hole is filled with a low Young's modulus resin having a Young's modulus lower than a Young's modulus of the molding resin.

Effects of the Invention

According to the present disclosure, when the semiconductor device is soldered to a cooler, even if the solder joining the semiconductor element and the lead frame melts and expands in volume, the low Young's modulus resin filled in the hole is softened and deformed in the direction of forming a space in the hole, so that the excessive solder corresponding to the volume expansion can be accommodated in the hole. As a result, it is possible to suppress an increase in the internal pressure of the molding resin, so that it is possible to suppress generation of a crack in the molding resin.

Furthermore, since the hole is filled with the low Young's modulus resin, entry of moisture from the outside can be suppressed.

The object, features, aspects, and advantages of the present disclosure will become more apparent with the following detailed description and the accompanying drawings.

BRIEF DESCRIPTION OF DRAWINGS

FIG. 1 is a sectional view illustrating a semiconductor device according to a first embodiment mounted on a cooler by soldering.

FIG. 2 is a plan view of the semiconductor device according to the first embodiment.

DESCRIPTION OF EMBODIMENTS

First Embodiment

Figure 3:
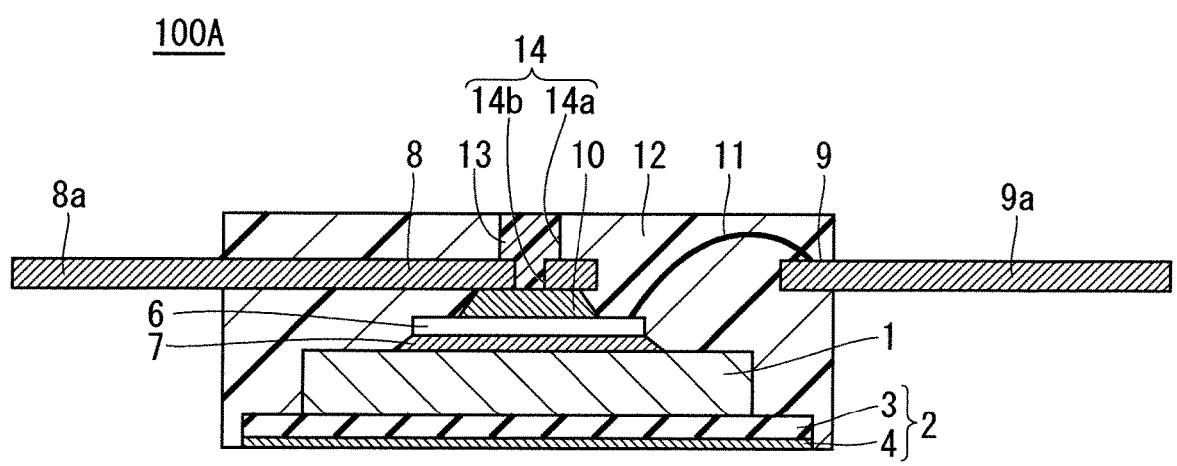
FIG. 3 is a sectional view of a semiconductor device according to a second embodiment.

A first embodiment will be described below with reference to the drawings. FIG. 1 is a sectional view illustrating a semiconductor device 100 according to the first embodiment mounted on a cooler 50 by soldering. FIG. 2 is a plan view of the semiconductor device 100.

As illustrated in FIGS. 1 and 2, the semiconductor device 100 is used for an inverter that controls a motor of an electric car, a train, or the like, and a converter for regeneration. The semiconductor device 100 is mounted on an upper surface of the cooler 50 via solder 5 without grease.

The semiconductor device 100 includes a heat spreader 1, a semiconductor element 6, an insulating sheet 2, a plurality of lead frames 8, a plurality of lead frames 9, and a molding resin 12.

The semiconductor element 6 is provided on an upper surface of the heat spreader 1 via solder 7. The insulating sheet 2 is attached to a lower surface of the heat spreader 1. The insulating sheet 2 includes an insulating resin 3 and a copper foil 4 attached to a lower surface of the insulating resin 3.

One of the plurality of lead frames 8 is joined to an upper surface of the semiconductor element 6 via solder 10. One of the plurality of lead frames 9 is connected to the semiconductor element 6 via a wire 11.

The molding resin 12 is made of, for example, epoxy resin, and forms a package of the semiconductor device 100. The molding resin 12 seals one end sides of the lead frames 8 and 9, the semiconductor element 6, the heat spreader 1, and the insulating sheet 2. Specifically, the molding resin 12 seals portions of the lead frames 8 and 9 excluding outer leads 8a and 9a, and portions of the semiconductor element 6, the heat spreader 1, and the insulating sheet 2 excluding the lower surfaces. Therefore, the lower surface of the copper foil 4 of the insulating sheet 2 is exposed from the molding resin 12.

A hole 14 is formed from the upper surface of the molding resin 12 to the joining surface with the semiconductor element 6 in the lead frame 8 to which the semiconductor element 6 is joined. The hole 14 is formed in a vertical cylindrical shape, and the contour of the hole 14 in plan view is smaller than the contour of the solder 10 disposed on the joining surface of the semiconductor element 6 in plan view. The hole 14 is filled with a low Young's modulus resin 13 having a Young's modulus lower than that of the molding resin 12. The low Young's modulus resin 13 is, for example, a silicone resin.

Next, a method for manufacturing the semiconductor device 100 according to the first embodiment will be described. First, in a die bonding step, the semiconductor element 6 is joined to the heat spreader 1 by the solder 7.

Next, in a frame joining step, the lead frames 8 and 9 are fixed by jigs so as to keep a constant distance from the die-bonded semiconductor element 6, molten solder is poured from a solder supply hole (not illustrated) of the lead frame 8, and the semiconductor element 6 and the lead frame 8 are joined by filling the distance therebetween.

Next, in a wire bonding step, a signal wire pad of the semiconductor element 6 and the lead frame 9 are connected by the wire 11.

Next, in a molding step, first, the insulating sheet 2 is disposed on a bottom surface of a lower mold constituting a lower portion of a mold. A wire bond completed product, which is an assembly of the heat spreader 1, the semiconductor element 6, and the lead frames 8 and 9, is disposed thereon. Next, an upper mold constituting an upper portion of the mold is closed.

Then, a resin as a base of the molten molding resin 12 is poured from the gate of the mold into a cavity of the mold to cure the resin in the mold, and then the mold is opened to take out the semiconductor device 100. At this time, an interface between the insulating resin 3 of the insulating sheet 2 and the heat spreader 1 and an interface between the insulating resin 3 and the molding resin 12 are bonded by softening of the insulating resin 3 of the insulating sheet 2.

Next, in a lead processing step, unnecessary connection portions in the lead frames 8 and 9 are cut using a lead processing mold and bent into a predetermined shape.

Next, the hole 14 is formed from the upper surface of the molding resin 12 to the joining surface of the lead frame 8 with the semiconductor element 6. The hole 14 is filled with the low Young's modulus resin 13 such as a silicone resin, and the low Young's modulus resin 13 is cured. Note that, as a method for forming the hole 14 in the molding resin 12 and the lead frame 8, a mechanical method such as punching or laser processing, or a chemical method such as etching is used.

Next, the semiconductor device 100 is soldered to the upper surface of the cooler 50, so that heat can be dissipated without grease.

Next, functions and effects of the semiconductor device 100 according to the first embodiment will be described.

When the semiconductor device 100 is soldered to the cooler 50, the cooler 50 and the semiconductor device 100 also need to be set to a temperature equal to or higher than the melting temperature of the solder 5 in order to conform the solder 5. Then, the solder in the molding resin 12 also melts, and the volume of the solder expands.

The volume of the portion where the solder exists in the molding resin 12 is equal to the volume of the solder before melting, and a volume for releasing the molten solder is required in the molding resin 12. A hard resin such as epoxy is generally used as the molding resin 12, and there is a problem that a crack occurs in the molding resin 12 when the molding resin 12 is deformed due to an increase in internal pressure.

On the other hand, the semiconductor device 100 according to the first embodiment includes: the heat spreader 1; the semiconductor element 6 provided on the upper surface of the heat spreader 1; the insulating sheet 2 provided on the lower surface of the heat spreader 1; the lead frames 8 and 9 joined to the upper surface of the semiconductor element 6 via the solder 10; and the molding resin 12 that seals the one end sides of the lead frames 8 and 9, the semiconductor element 6, the heat spreader 1, and the insulating sheet 2. The hole 14 is formed from the upper surface of the molding resin 12 to the joining surface of the lead frame 8 with the semiconductor element 6, and the hole 14 is filled with the low Young's modulus resin 13 having a Young's modulus lower than that of the molding resin 12.

Therefore, when the semiconductor device 100 is soldered to the cooler 50, even if the solder 10 joining the semiconductor element 6 and the lead frame 8 melts and expands in volume, the low Young's modulus resin 13 filled in the hole 14 is softened and deformed in the direction of forming a space in the hole 14, so that the excessive solder 10 corresponding to the volume expansion can be accommodated in the hole 14. As a result, it is possible to suppress an increase in the internal pressure of the molding resin 12, so that it is possible to suppress generation of a crack in the molding resin 12.

Furthermore, since the hole 14 is filled with the low Young's modulus resin 13, entry of moisture from the outside can be suppressed. This makes it possible to suppress deterioration in withstand voltage and corrosion of the semiconductor element 6. As described above, the semiconductor device 100 can be used for a long period of time.

Second Embodiment

Figure 4:
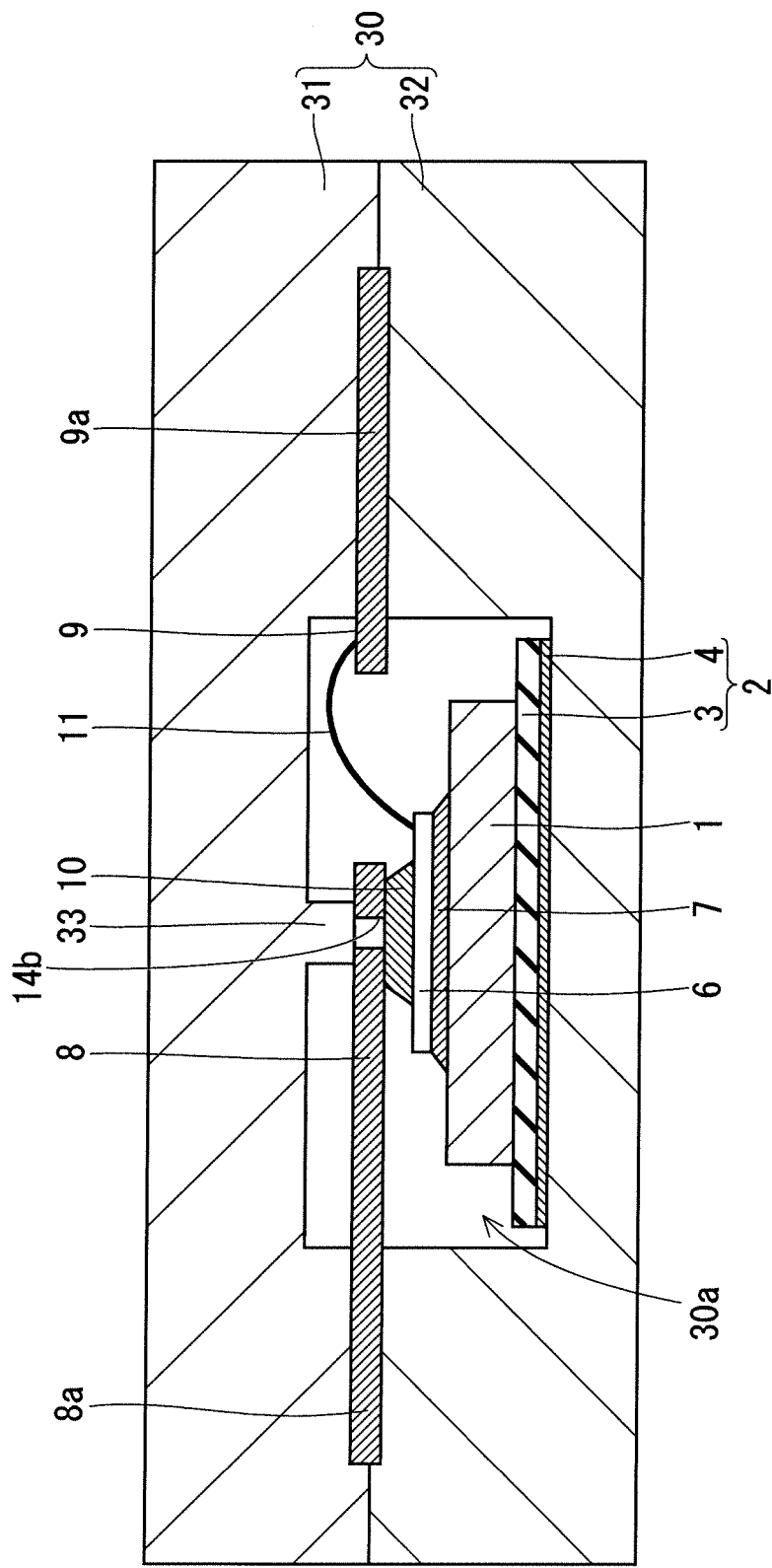
FIG. 4 is a sectional view illustrating a method for manufacturing the semiconductor device according to the second embodiment.

Next, a semiconductor device 100A according to a second embodiment will be described. FIG. 3 is a sectional view of the semiconductor device 100A. FIG. 4 is a sectional view illustrating a method for manufacturing the semiconductor device 100A. Note that, in the second embodiment, the same components as those described in the first embodiment are denoted by the same reference numerals, and description thereof is omitted.

As illustrated in FIG. 3, in the second embodiment, a structure of the hole 14 is different from that of the semiconductor device 100 according to the first embodiment. The hole 14 includes a resin side hole 14a and a solder supply hole 14b. Note that, in FIG. 3, bending is not performed in the lead processing step.

The solder supply hole 14b is formed in a penetrating manner in the lead frame 8, and is a vertically cylindrical hole to which the molten solder is supplied to form the solder 10 between the lead frame 8 and the semiconductor element 6 in the frame joining step. The resin side hole 14a is formed from the upper surface of the molding resin 12 to the upper surface of the lead frame 8. The resin side hole 14a is a vertical cylindrical hole and communicates with the solder supply hole 14b. The contour of the resin side hole 14a in plan view is formed to be larger than the contour of the solder supply hole 14b in plan view.

The low Young's modulus resin 13 is filled in the hole 14, that is, in the resin side hole 14a and the solder supply hole 14b.

Next, the method for manufacturing the semiconductor device 100A will be described with reference to FIG. 4. Here, only portions different from those in the first embodiment will be described.

As illustrated in FIG. 4, a cylindrical pin 33 protruding downward is provided inside an upper mold 31 constituting a mold 30. When the mold 30 is clamped, the pin 33 abuts on the periphery of the solder supply hole 14b in the lead frame 8.

After the die bonding step, the frame joining step, and the wire bonding step are completed, in the molding step, the insulating sheet 2 is first disposed on the bottom surface of the lower mold 32 constituting the lower portion of the mold 30. A wire bond completed product, which is an assembly of the heat spreader 1, the semiconductor element 6, and the lead frames 8 and 9, is disposed thereon. Next, the upper mold 31 constituting the upper portion of the mold 30 is closed.

Then, a resin as a base of the molten molding resin 12 is poured from the gate of the mold 30 into the cavity 30a of the mold 30 to cure the resin in the mold 30. At this time, since the pin 33 is in contact with the periphery of the solder supply hole 14b, even if the resin is injected into the cavity 30a, the resin does not enter the solder supply hole 14b. Further, since the resin side hole 14a is formed at the position of the pin 33, the resin side hole 14a and the solder supply hole 14b communicate with each other to form the hole 14.

The mold 30 is opened, and the semiconductor device 100A is taken out. At this time, an interface between the insulating resin 3 of the insulating sheet 2 and the heat spreader 1 and an interface between the insulating resin 3 and the molding resin 12 are bonded by softening of the insulating resin 3 of the insulating sheet 2. Next, the lead processing step is performed.

As described above, in the semiconductor device 100A according to the second embodiment, the portion of the hole 14 formed in the lead frame 8 is the solder supply hole 14b through which the solder is supplied between the lead frame 8 and the semiconductor element 6.

Therefore, in addition to the effect similar to that of the first embodiment, the hole 14 can be more easily formed by using the solder supply hole 14b originally formed in the lead frame 8 as a part of the hole 14 filled with the low Young's modulus resin 13.

Further, the method for manufacturing the semiconductor device 100A according to the second embodiment includes: a step (a) of disposing the insulating sheet 2, and the assembly of the heat spreader 1, the semiconductor element 6, and the lead frames 8 and 9 on the bottom surface of the lower mold 32; a step (b) of bringing the pin 33 provided in the upper mold 31 into contact with the periphery of the solder supply hole 14b on the upper surface of the lead frame 8, clamping the mold 30 in a state where the pin 33 closes the solder supply hole 14b, injecting a resin into the cavity 30a formed by the upper mold 31 and the lower mold 32, and molding the molding resin 12 having the hole 14; and a step (c) of injecting the low Young's modulus resin 13 into the hole 14.

Therefore, since the hole 14 is formed in the step (b) of molding the molding resin 12, it is not necessary to make a hole in the molding resin 12 after this step.

Third Embodiment

Figure 5:
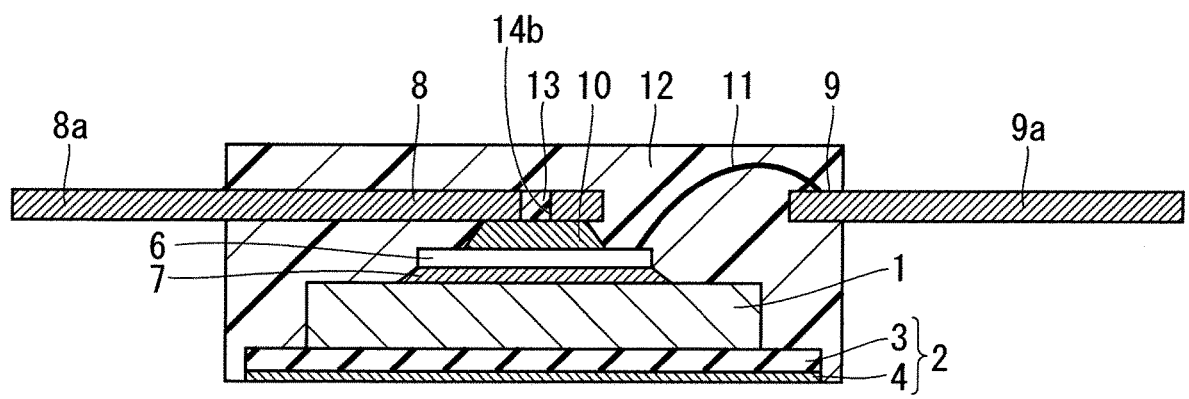
FIG. 5 is a sectional view of a semiconductor device according to a third embodiment.
Figure 6:
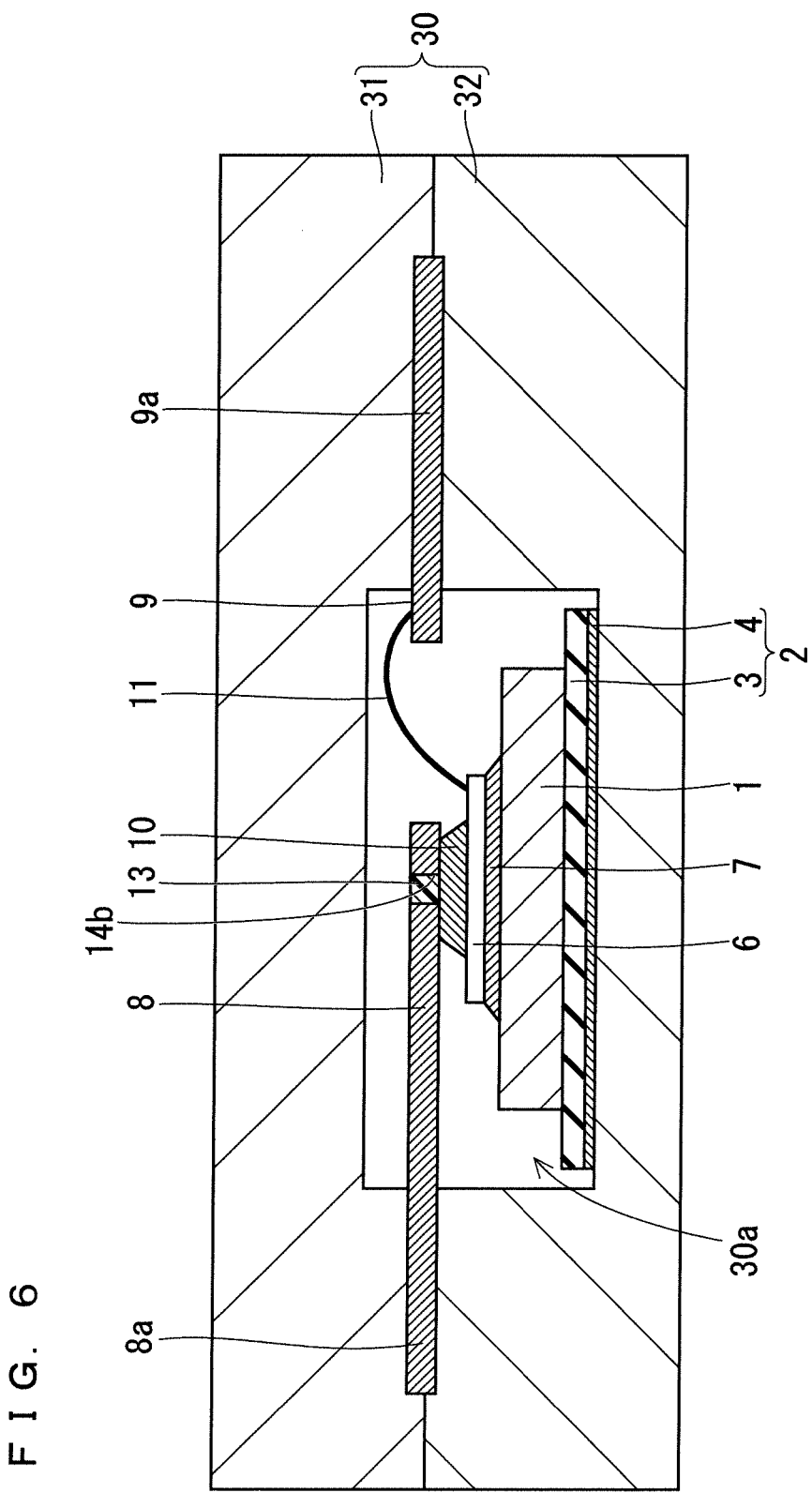
FIG. 6 is a sectional view illustrating a method for manufacturing the semiconductor device according to the third embodiment.

Next, a semiconductor device 100B according to a third embodiment will be described. FIG. 5 is a sectional view of the semiconductor device 100B according to the third embodiment. FIG. 6 is a sectional view illustrating a method for manufacturing the semiconductor device 100B. Note that, in the third embodiment, the same components as those described in the first and second embodiments are denoted by the same reference numerals, and description thereof is omitted.

As illustrated in FIG. 5, in the third embodiment, the resin side hole 14a is not formed, and only the solder supply hole 14b is filled with the low Young's modulus resin 13. Therefore, the low Young's modulus resin 13 is not exposed on the upper surface of the molding resin 12. Note that, in FIG. 5, bending is not performed in the lead processing step.

Next, the method for manufacturing the semiconductor device 100B will be described with reference to FIG. 6. Here, only portions different from those in the first and second embodiments will be described.

As illustrated in FIG. 6, the pin 33 is not provided inside the upper mold 31 constituting the mold 30. After the die bonding step, the frame joining step, and the wire bonding step are completed, the low Young's modulus resin 13 is filled in the solder supply hole 14b before the molding step, and the low Young's modulus resin 13 is cured.

As described above, the semiconductor device 100B according to the third embodiment includes: the heat spreader 1; the semiconductor element 6 provided on the upper surface of the heat spreader 1; the insulating sheet 2 provided on the lower surface of the heat spreader 1; the lead frames 8 and 9 joined to the upper surface of the semiconductor element 6 via the solder 10; and the molding resin 12 that seals the one end sides of the lead frames 8 and 9, the semiconductor element 6, the heat spreader 1, and the insulating sheet 2. The solder supply hole 14b to which the solder is supplied between the lead frame 8 and the semiconductor element 6 is formed in the lead frame 8, and the solder supply hole 14b is filled with the low Young's modulus resin 13 having a Young's modulus lower than that of the molding resin 12. Next, the molding step and the lead processing step are performed.

Therefore, when the semiconductor device 100B is soldered to the cooler 50, even if the solder 10 joining the semiconductor element 6 and the lead frame 8 melts and expands in volume, the low Young's modulus resin 13 filled in the solder supply hole 14b is softened and deformed in the direction of forming a space in the solder supply hole 14b, so that the excessive solder 10 corresponding to the volume expansion can be accommodated in the solder supply hole 14b. As a result, it is possible to suppress an increase in the internal pressure of the molding resin 12, so that it is possible to suppress generation of a crack in the molding resin 12.

Furthermore, since the interface between the molding resin 12 and the low Young's modulus resin 13 is not exposed on the upper surface of the molding resin 12, it is possible to further suppress entry of moisture from the outside. This makes it possible to suppress deterioration in withstand voltage and corrosion of the semiconductor element 6.

The method for manufacturing the semiconductor device 100B according to the third embodiment includes a step (d) of disposing the insulating sheet 2 and the assembly of the heat spreader 1, the semiconductor element 6, and the lead frames 8 and 9 on the bottom surface of the lower mold 32, a step (e) of injecting the low Young's modulus resin 13 into the solder supply hole 14b of the lead frame 8, and a step (f) of clamping the mold 30 and injecting the resin into the cavity 30a formed by the upper mold 31 and the lower mold 32 to mold the molding resin 12.

Therefore, by using the solder supply hole 14b, it is not necessary to make a hole in the molding resin 12 after the molding step, and the semiconductor device 100B can be easily manufactured.

Fourth Embodiment

Figure 7:
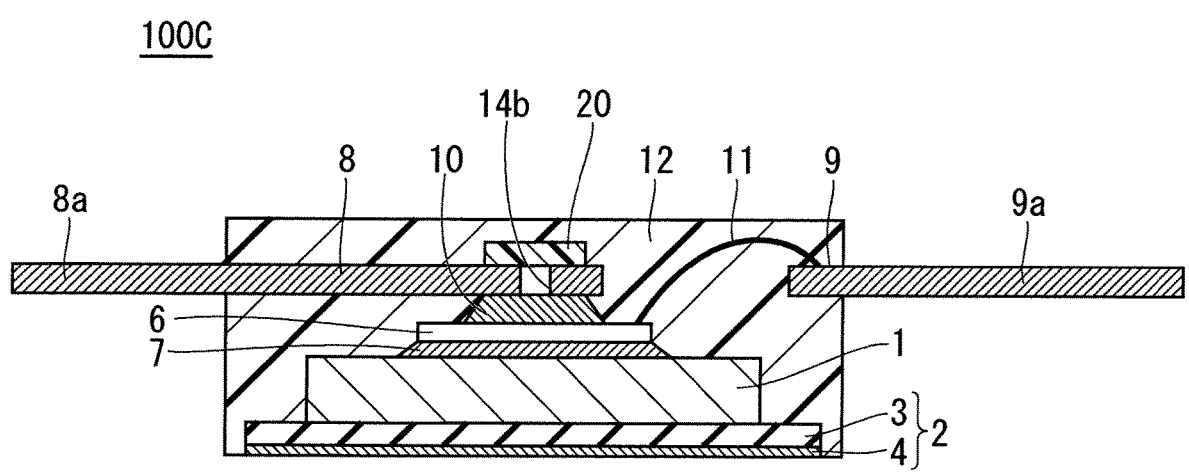
FIG. 7 is a sectional view of a semiconductor device according to a fourth embodiment.
Figure 8:
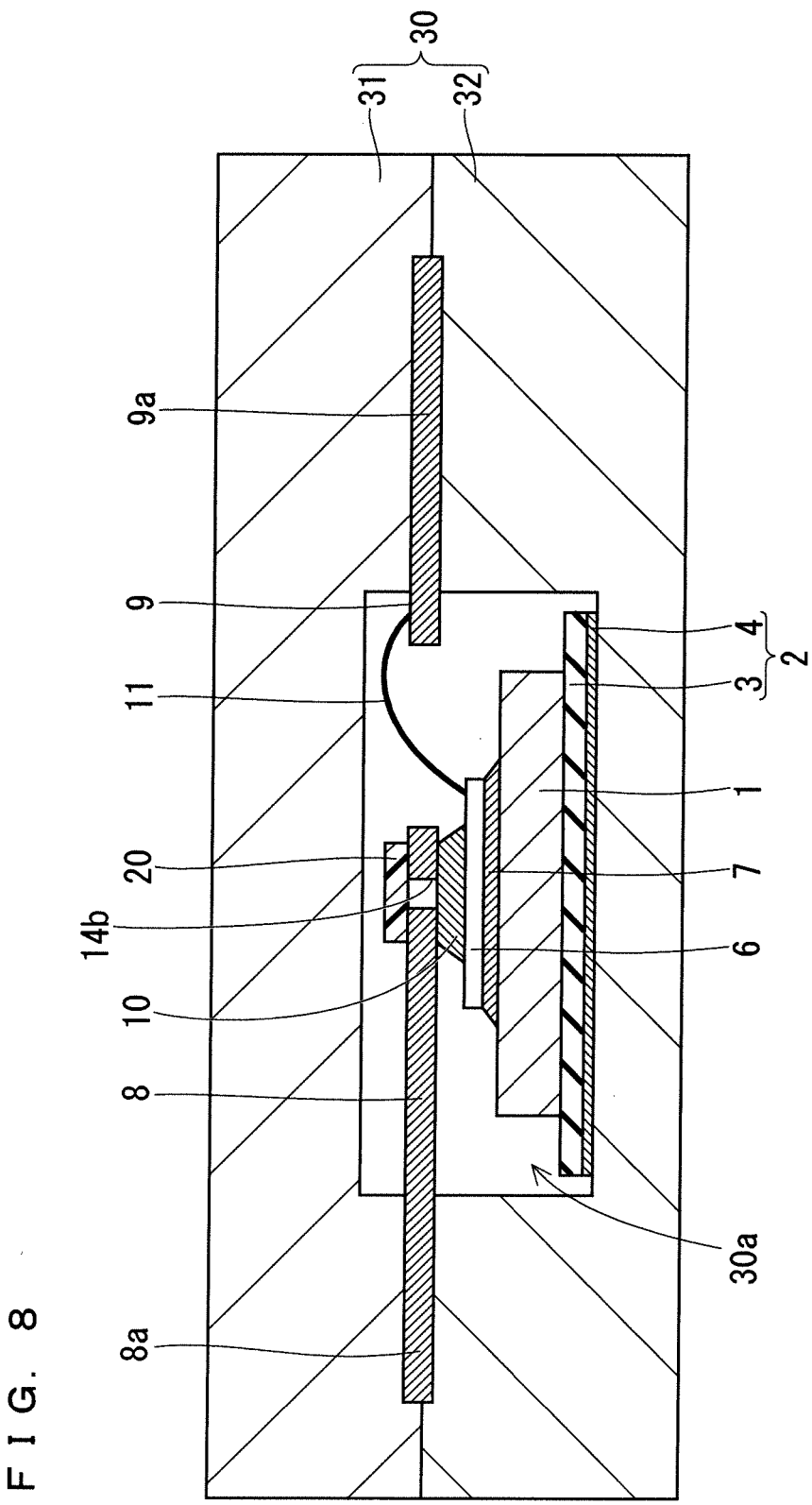
FIG. 8 is a sectional view illustrating a method for manufacturing the semiconductor device according to the fourth embodiment.

Next, a semiconductor device 100C according to a fourth embodiment will be described. FIG. 7 is a sectional view of a semiconductor device 100C according to the fourth embodiment. FIG. 8 is a sectional view illustrating a method for manufacturing the semiconductor device 100C. Note that, in the fourth embodiment, the same components as those described in the first to third embodiments are denoted by the same reference numerals, and description thereof is omitted.

As illustrated in FIG. 7, in the fourth embodiment, the semiconductor device 100C includes a lid 20 as compared with the semiconductor device 100B according to the third embodiment. Further, the solder supply hole 14b is not filled with the low Young's modulus resin 13. Note that, in FIG. 7, bending is not performed in the lead processing step.

The lid 20 is made of a resin plate or a metal plate so as not to be deformed by the pressure of the molding resin 12, and is disposed around the solder supply hole 14b on the upper surface of the lead frame 8. The lid 20 has a contour larger than the contour of the solder supply hole 14b in plan view so as to be able to close the solder supply hole 14b. The upper side of the solder supply hole 14b is closed by the lid 20, and the lower side of the solder supply hole 14b is closed by the solder 10. That is, a space is formed at a position in contact with the solder 10. Therefore, even if the solder 10 joining the semiconductor element 6 and the lead frame 8 melts and expands in volume, the excessive solder 10 corresponding to the volume expansion can be accommodated in the solder supply hole 14b.

Next, the method for manufacturing the semiconductor device 100C will be described with reference to FIG. 8.

Here, only portions different from those in the first to third embodiments will be described.

After the die bonding step, the frame joining step, and the wire bonding step are completed, in the molding step, the insulating sheet 2 is first disposed on the bottom surface of the lower mold 32 constituting the lower portion of the mold 30. A wire bond completed product, which is an assembly of the heat spreader 1, the semiconductor element 6, and the lead frames 8 and 9, is disposed thereon. The lid 20 is disposed around the solder supply hole 14b on the upper surface of the lead frame 8, and a space surrounded by the lid 20, the solder supply hole 14b, and the solder 10 is formed. Next, the upper mold 31 constituting the upper portion of the mold 30 is closed.

Then, a resin as a base of the molten molding resin 12 is poured from the gate of the mold 30 into the cavity 30a of the mold 30 to cure the resin in the mold 30, and then the mold is opened to take out the semiconductor device 100. At this time, an interface between the insulating resin 3 of the insulating sheet 2 and the heat spreader 1 and an interface between the insulating resin 3 and the molding resin 12 are bonded by softening of the insulating resin 3 of the insulating sheet 2. Next, the lead processing step is performed.

As described above, the semiconductor device 100C according to the fourth embodiment includes: the heat spreader 1; the semiconductor element 6 provided on the upper surface of the heat spreader 1; the insulating sheet 2 provided on the lower surface of the heat spreader 1; the lead frames 8 and 9 joined to the upper surface of the semiconductor element 6 via the solder 10; and the molding resin 12 that seals the one end sides of the lead frames 8 and 9, the semiconductor element 6, the heat spreader 1, and the insulating sheet 2. The solder supply hole 14b to which the solder is supplied between the lead frame 8 and the semiconductor element 6 is formed in the lead frame 8, and the semiconductor device 100C further includes the lid 20 disposed around the solder supply hole 14b on the upper surface of the lead frame 8 to close the solder supply hole 14b.

Therefore, when the semiconductor device 100C is soldered to the cooler 50, even if the solder 10 joining the semiconductor element 6 and the lead frame 8 melts and expands in volume, the excessive solder 10 corresponding to the volume expansion can be accommodated in the solder supply hole 14b. As a result, it is possible to suppress an increase in the internal pressure of the molding resin 12, so that it is possible to suppress generation of a crack in the molding resin 12.

Furthermore, since the space capable of accommodating the solder 10 is not exposed on the upper surface of the molding resin 12, entry of moisture from the outside can be further suppressed. This makes it possible to further suppress deterioration in withstand voltage and corrosion of the semiconductor element 6.

Further, the method for manufacturing the semiconductor device 100C includes a step (g) of disposing the insulating sheet 2 and the assembly of the heat spreader 1, the semiconductor element 6, and the lead frames 8 and 9 on the bottom surface of the lower mold 32, and a step (h) of disposing the lid 20 around the solder supply hole 14b on the upper surfaces of the lead frames 8 and 9, clamping the mold 30 in a state where the lid 20 closes the solder supply hole 14b, and injecting a resin into the cavity 30a formed by the upper mold 31 and the lower mold 32 to mold the molding resin 12.

Therefore, by using the solder supply hole 14b, it is not necessary to make a hole in the molding resin 12 after the molding step. Furthermore, since it is not necessary to fill the low Young's modulus resin 13, the semiconductor device 100C can be more easily manufactured.

Although this disclosure has been described in detail, the above description is illustrative and not restrictive in all aspects. It is understood that numerous modifications not illustrated can be assumed.

Note that the embodiments can be freely combined, and the embodiments can be appropriately modified or omitted.

EXPLANATION OF REFERENCE SIGNS

1: heat spreader
2: insulating sheet
6: semiconductor element
8, 9: lead frame
10: solder
12: molding resin
13: low Young's modulus resin
14: hole
14b: solder supply hole
20: lid
30: mold
30a: cavity
31: upper mold
32: lower mold
33: pin
100, 100A, 100B, 100C: semiconductor device

The invention claimed is:

1. A semiconductor device comprising:
   a heat spreader;
   a semiconductor element provided on an upper surface of the heat spreader;
   an insulating sheet provided on a lower surface of the heat spreader;
   a lead frame joined to an upper surface of the semiconductor element via solder; and
   a molding resin that seals one end side of the lead frame, the semiconductor element, the heat spreader, and the insulating sheet,
   wherein a hole is formed from an upper surface of the molding resin to a joining surface of the lead frame with the semiconductor element, and
   wherein the hole is filled with a low Young's modulus resin having a Young's modulus lower than a Young's modulus of the molding resin.

2. The semiconductor device according to claim 1, wherein a portion of the hole formed in the lead frame is a solder supply hole through which the solder is supplied between the lead frame and the semiconductor element.

3. A method for manufacturing a semiconductor device for manufacturing the semiconductor device according to claim 2, the method comprising:
   (a) disposing the insulating sheet, and the assembly of the heat spreader, the semiconductor element, and the lead frame on a bottom surface of a lower mold;
   (b) bringing a pin provided in an upper mold into contact with a periphery of the solder supply hole on an upper surface of the lead frame, clamping a mold in a state where the pin closes the solder supply hole, and injecting a resin into a cavity formed by the upper mold and the lower mold to mold the molding resin having the hole; and
   (c) injecting the low Young's modulus resin into the hole.

4. A semiconductor device comprising:
   a heat spreader;
   a semiconductor element provided on an upper surface of the heat spreader;
   an insulating sheet provided on a lower surface of the heat spreader;
   a lead frame joined to an upper surface of the semiconductor element via solder; and
   a molding resin that seals one end side of the lead frame, the semiconductor element, the heat spreader, and the insulating sheet,
   wherein a solder supply hole through which the solder is supplied between the lead frame and the semiconductor element is formed in the lead frame, and
   wherein the solder supply hole is filled with a low Young's modulus resin having a Young's modulus lower than a Young's modulus of the molding resin.

5. A method for manufacturing a semiconductor device for manufacturing the semiconductor device according to claim 4, the method comprising:
   (d) disposing the insulating sheet, and the assembly of the heat spreader, the semiconductor element, and the lead frame on a bottom surface of a lower mold;
   (e) injecting the low Young's modulus resin into the solder supply hole of the lead frame; and
   (f) performing clamping of a mold, and injecting a resin into a cavity formed by an upper mold and the lower mold to mold the molding resin.

6. A semiconductor device comprising:
   a heat spreader;
   a semiconductor element provided on an upper surface of the heat spreader;
   an insulating sheet provided on a lower surface of the heat spreader;
   a lead frame joined to an upper surface of the semiconductor element via solder; and
   a molding resin that seals one end side of the lead frame, the semiconductor element, the heat spreader, and the insulating sheet,
   wherein a solder supply hole through which the solder is supplied between the lead frame and the semiconductor element is formed in the lead frame, and
   wherein the semiconductor device further comprises a lid disposed around the solder supply hole on an upper surface of the lead frame to close the solder supply hole.

7. A method for manufacturing a semiconductor device for manufacturing the semiconductor device according to claim 6, the method comprising:
   (g) disposing the insulating sheet, and the assembly of the heat spreader, the semiconductor element, and the lead frame on a bottom surface of a lower mold; and
   (h) disposing the lid around the solder supply hole on an upper surface of the lead frame, clamping a mold in a state where the lid closes the solder supply hole, and injecting a resin into a cavity formed by an upper mold and the lower mold to mold the molding resin.

* * * * *